United States Patent [19]

Kioi

[11] Patent Number: 6,009,021
[45] Date of Patent: Dec. 28, 1999

[54] MOS LOGIC CIRCUIT WITH HOLD OPERATION

[75] Inventor: Kazumasa Kioi, Fujiidera, Japan

[73] Assignee: Sharp Kabushiki Kaisha, Osaka, Japan

[21] Appl. No.: 08/956,541

[22] Filed: Oct. 23, 1997

[30] Foreign Application Priority Data

Dec. 25, 1996 [JP] Japan ..................................... 8-346028

[51] Int. Cl.$^6$ ................................................. G11C 16/04
[52] U.S. Cl. ............................... 365/189.06; 365/189.09; 326/121
[58] Field of Search ............................... 326/121, 83, 86, 326/21, 33; 365/189.06, 189.07, 189.09

[56] References Cited

U.S. PATENT DOCUMENTS 5,877,634  3/1999  Hunley ....................................... 326/83

OTHER PUBLICATIONS

Seitz et al, "Hot–Clock nMOS," Chapel Hill Conference on VLSI (1985) pp. 1–17.
Kramer et al., "2nd Order Adiabatic Computation with 2N–2P and 2N–2NP Logic Circuits, " ISLPD '95 Symposium Proceedings, pp. 191–196.
Assaderaghi et al., "A Dynamic Threshold Voltage MOSFET (DTMOS) for Ultra–Low Voltage Operation," IEEE (1994), pp. 809–812.
Moon et al., "An Efficient Charge Recovery Logic Circuit," IEEE Journal of Solid–State Circuits, vol. 31, No. 4 (Apr. 1996) pp. 514–522.
Kioi et al, "forward body–bias MOS (FBMOS) dual rail logic using an adiabatic charging technique with sub–0.6V operation," Electronic Letters, vol. 33, No. 14 (Jul. 3, 1997) pp. 1200–1201.

Athas et al., "Low–Power Digital Systems Based on Adiabatic–Switching Principles," IEEE Transactions on Very Large Scale Integration (VLSI) Systems, vol. 2, No. 4 (Dec. 1994) pp. 398–407.

Landauer, "Irreversibility and Heat Generation in the Computing Process," IBM Journal (Jul. 1961) pp. 183–191.

Kotaki et al., "Novel Bulk Dynamic Threshold Voltage MOSFET (B–DTMOS) with Advanced Isolation (SITOS) and Gate to Shallow–Well Contact (SSS–C) Processes for Ultra Low Power Dual Gate CMOS," IEEE (1996) pp. 459–462.

*Primary Examiner*—David Nelms
*Assistant Examiner*—David Lam
*Attorney, Agent, or Firm*—Birch, Stewart, Kolasch & Birch, LLP

[57] ABSTRACT

A MOS logic circuit is charged by adiabatic charging, and is composed of a clamp circuit having a pair of PMOS transistors, and two functional circuits, each having at least one NMOS transistor, a gate electrode of each of the NMOS transistors being an input node, one terminal of each functional circuit being connected to a common constant-voltage power source, and the other terminal of each functional circuit being connected to a drain electrode of the corresponding PMOS transistor, thus forming an output node. A substrate electrode of each of the NMOS transistors making up the two functional circuits is cross-connected to the output node of the other functional circuit. In this way, even in the HOLD operation, in which both input nodes fall to low level, the NMOS transistor which is to output low level becomes depletion mode, and the outputting operations are stabilized without increasing circuit size.

18 Claims, 16 Drawing Sheets

FIG. 14
PRIOR ART

|  | F1 | F2 | F3 | F4 |
|---|---|---|---|---|
| $t_0 \to t_1$ | WAIT (#1) | RESET | • | • |
| $t_1 \to t_2$ | EVALUATE(#1) | WAIT (#1) | RESET | • |
| $t_2 \to t_3$ | HOLD(#1) | EVALUATE(#1) | WAIT (#1) | RESET |
| $t_3 \to t_4$ | RESET(#1) | HOLD(#1) | EVALUATE(#1) | WAIT (#1) |
| $t_4 \to t_5$ | WAIT (#2) | RESET(#1) | HOLD(#1) | EVALUATE(#1) |
| $t_5 \to t_6$ | • | WAIT(#2) | RESET(#1) | HOLD (#1) |
| $t_6 \to t_7$ | • | • | WAIT(#2) | RESET(#1) |
| $t_7 \to t_8$ | • | • | • | WAIT(#2) |

MOS LOGIC CIRCUIT WITH HOLD OPERATION

FIELD OF THE INVENTION

The present invention is generally concerned with a logic circuit provided in a MOS integrated circuit, and in particular with a MOS logic circuit which uses adiabatic charging to achieve low power consumption.

BACKGROUND OF THE INVENTION

An adiabatic charging circuit is one method of reducing power consumption in MOS chip logic circuits, as proposed by Seitz, C. L., Frey, A. H., Mattisson, S., Rabin, S. D., Speck, D. A., and van de Snepscheut, J. L. A. in "Hot-Clock nMOS," *Proceedings of the 1985 Chapel Hill Conference on VLSI*, pp. 1–17 (Computer Science Press, 1985). The following will explain this adiabatic charging.

In charging the voltage of a certain node in a standard CMOS circuit, from the time the switch connected to the power source (MOSFET) is closed until the node (capacity C) is fully charged, the resistance of the switch results in the dissipation of $(½) \times CV^2$ of energy, where V is the potential difference across the switch. However, when the potential of the node and the potential of the power source are equal, the current will not flow through the switch even when the power source and the node are connected through the switch, and there will accordingly be no dissipation of energy due to the resistance of the switch.

Accordingly, when the voltage of the power source is increased slowly in comparison with the time constant RC of the switch resistance R and the node capacitance C, it is possible to increase the potentials of the node and the power source in such a way that the potential difference across the switch is reduced and so that the potentials of the node and the power source remain close to one another. In this way, the potential of the node can be balanced with the power source, and the capacitance of the node can be charged adiabatically. In such a case, the energy dissipated by the resistance of the switch will be:

$$E = \int_0^T RI^2 \, dt = \int_0^T R\left(c\frac{dV}{dt}\right)^2 dt \quad (1)$$

Here, T is the time necessary for this process, and V (t) is the voltage characteristic of the capacitance.

If the curve of the voltage is a line, R and T are constant, and T ≫ RC, then equation (1) above becomes analogous to equation (2) below:

$$E = (½) \cdot CV^2 \cdot (2RC/T) \quad (2)$$

If the curve of the voltage is a sine wave, equation (2) above is multiplied by the coefficient $\pi^2/8$.

Equation (2) above shows that if T is increased infinitely, the amount of energy necessary to charge the node capacity can be reduced to zero. This method of quasi-static charging is the adiabatic charging referred to above. The amount of energy dissipated in this adiabatic charging is substantially different from that in standard CMOS charging, where, as noted above, $(½) \times CV^2$ of energy is dissipated, regardless of time; i.e., regardless of constant RC.

For example, in the case of the CMOS inverter shown in FIG. 7, when input IN sent to input node KI changes as shown in FIG. 8(a), output OUT⁻ from output node KO will change as shown in FIG. 8(b). More specifically, when the input IN falls from high level to low level at time t11, PMOS transistor QP is turned on, and NMOS transistor QN is turned off. Accordingly, the charging current (shown by reference symbol I1) from power line 1 flows through the PMOS transistor QP to charge the output node KO. The output node KO will be charged to the potential Vdd of the power source to which the power line 1 is connected.

In contrast, when the input IN rises from low level to high level at time t12, the PMOS transistor QP is turned off, and the NMOS transistor QN is turned on. The charge of the output node KO is discharged (as discharge current I2) through the NMOS transistor QN to power line 2.

Accordingly, in this kind of regular charging, as shown in FIG. 9, the energy loss due to switching results from the potential difference V1 between the fixed potential Vdd of the power source (shown by reference symbol α1) and the potential of the output node KO (shown by reference symbol α2). In contrast, in the adiabatic charging method mentioned above, the potential of the power source changes as shown by reference symbol α3, and accordingly the potential of the output node KO also changes as shown by reference symbol α4. Thus the energy loss is reduced to a small amount corresponding to the potential difference shown by reference symbol V2.

In recent years many MOS transistor circuits using this kind of adiabatic charging have been proposed, for example, Moon, Y. and Jeong, D.-K.: "Efficient Charge Recovery Logic," 1995 *Symposium on VLSI Circuits: Digest of Technical Pacers*, pp. 129–130 (May 1995), and Kramer, A., Denker, J. S., Flower, B., and Moroney, J.: "2nd Order Adiabatic Computation with 2N–2P and 2N–2N2P Logic Circuits," *Porc. Int. Symp. Low Power Design*, pp. 191–196 (Dana Point, April 1995). FIG. 10 shows MOS logic circuit F0, a typical example of this kind of conventional art.

This MOS logic circuit F0 is the inverter/buffer gate of a dual rail logic circuit called an "ECRL (Efficient Charge Recovery Logic) Circuit" or a "2N–2P Circuit." In brief, this MOS logic circuit F0 is arranged so that a serial circuit consisting of a PMOS transistor QP1 and an NMOS transistor QN1, and a serial circuit consisting of a PMOS transistor QP2 and an NMOS transistor QN2 are connected in parallel between power lines 1 and 2.

The gate electrodes of the NMOS transistors QN1 and QN2 are connected to a first input node KI1 and a second input node KI2, respectively; an input IN⁺ is applied to the gate electrode of the NMOS transistor QN1, and an input IN⁻, which is logic-inverted with respect to the input IN⁺, is applied to the gate electrode of the NMOS transistor QN2. The connection between the drain electrode of the PMOS transistor QP2 and the drain electrode of the NMOS transistor QN2 provides a first output node KO1, from which the output OUT⁺ is applied to the gate electrode of the PMOS transistor QP1, to which it is cross-connected. In the same way, the connection between the drain electrode of the PMOS transistor QP1 and the drain electrode of the NMOS transistor QN1 provides a second output node KO2, from which the output OUT⁻ is applied to the gate electrode of the PMOS transistor QP2, to which it is cross-connected. The power line 1 is connected to a pulse power source φ, the voltage output level of which changes between ground level and a fixed high level Vdd. The power line 2, on the other hand, is connected to the output of a constant-voltage power source, the output level of which is equal to the ground level.

FIG. 11 is a wave-form diagram showing the operation of the MOS logic circuit F0 arranged as described above. In this MOS logic circuit F0, the operations of one cycle consist of four operations: "RESET," "WAIT," "EVALUATE," and "HOLD." The wave forms of the input IN⁺, the input IN⁻, the pulse power source φ, the output OUT⁺, and the output OUT⁻ on FIG. 10 correspond to FIGS. 11(*a*), (*b*), (*c*), (*d*), and (*e*), respectively.

First, in the RESET operation, the change in the level of the pulse power source φ from high level to low level (see FIG. 11(*c*)) is accompanied by a drop to low level of the output nodes KO1 and KO2, thereby erasing the respective data of the output nodes KO1 and KO2 (see FIGS. 11(*d*) and (*e*)). Next, in the WAIT operation, the voltage output level of the pulse power source φ remains at low level, while the input to either one of the input nodes (in the example in FIG. 10, the input IN⁺ to the input node KI1; see FIG. 11(*a*)) rises from low level to high level.

After an input state is established in this way, the EVALUATE operation is performed, in which the pulse power source φ rises from low level to high level (see FIG. 11(*c*)). At this time, since, as stated above, the input IN⁺ is high level, and the input IN⁻ is low level, the NMOS transistor QN1 is turned on, but the NMOS transistor QN2 is turned off; the PMOS transistor QP2 is turned on, and the level of the output OUT⁺ rises in response to the rise in the output voltage of the pulse power source φ (see FIG. 11(*d*)). Further, at this time, the MOS transistors QN2 and QP1 remain off, and the output OUT⁻ remains at low level (see FIG. 11(*e*)).

After the potentials of the output nodes KO1 and KO2 are established, the HOLD operation is performed, in which both the input nodes KI1 and KI2 fall to low level, and the input data is erased (see FIGS. 11(*a*) and (*b*)). The gate electrodes of the PMOS transistors QP1 and QP2, as stated above, are cross-connected to the output nodes KO1 and KO2, and therefore when the inputs IN⁺ and IN⁻ are erased, the NMOS transistors QN1 and QN2 are both turned off, but the high level of the output node KO1 is maintained (see FIG. 11(*d*)), and the low level of the output node KO2 is dynamically maintained because it is cut off from the constant-voltage power source.

In the next cycle, after performing a RESET operation in the same way, during a WAIT operation, the input IN⁻ rises from low level to high level, and the input IN⁺ remains at low level. As a result, in the next HOLD operation, the output OUT⁻ is maintained at high level (see FIG. 11(*e*)) and the output OUT⁺ is at low level (see FIG. 11(*d*)). The inverter/buffer operations are performed as described above.

By replacing the NMOS transistors QN1 and QN2, which are functional circuits, with the serial and/or parallel connections of a plurality of MOS transistors, a MOS logic circuit F0 can be a unit logic circuit capable of outputting the desired combinational logic in accordance with the above-noted connections. Further, a circuit can be structured in sequence using the unit logic circuits. For example, by using the inverter/buffer shown in FIG. 10 as a unit logic circuit, and connecting several such unit logic circuits in a multi-stage cascade, a sequential circuit such as that shown in FIG. 12 can be provided. Such a sequential circuit can be used, for example, as a shift register.

In the example shown in FIG. 12, inverter/buffers F1, F2, F3, and F4 are driven by pulse power sources φ1, φ2, φ3, and φ4, the phases of which are shifted ¼ cycle away from one another. It is sufficient if the pulse power sources φ3 and φ4 have the opposite phases with respect to φ1 and φ2, respectively, so that φ3=$\overline{φ1}$ and φ4=$\overline{φ2}$. Inputs IN⁺ and IN⁻ are sent to the first-stage inverter/buffer F1, and the output of each of the inverter/buffers F1, F2 and F3 is sent to the following inverter/buffer F2, F3, and F4, respectively. Outputs OUT⁺ and OUT⁻ are outputted from the last-stage inverter/buffer F4.

A wave-form diagram of the operations of the pulse power sources φ1, φ2, φ3, and φ4 is shown in FIG. 13. Next, the operations of the inverter/buffers F1 through F4 at t0, t1, t2, and so on are shown in FIG. 14. In FIG. 14, "#1" shows the data of the first cycle, and "#2" shows the data of the second cycle. In this way, the data #1, #2, and so on are shifted sequentially to the following stages each ¼ cycle, in synchronization with the cycles of the pulse power sources φ1 through φ4.

In the foregoing conventional MOS logic circuit, if the NMOS transistor QN1 or QN2 is turned on, the output node KO2 or KO1, respectively, will be maintained at low level. However, as mentioned above, during the HOLD operation, the input nodes KI1 and KI2 both fall to low level, and when the NMOS transistor QN1 or QN2 is turned off, whichever of the output nodes KO2 and KO1 is to output a low level is only maintained dynamically, and therefore is prone to be influenced by neighboring circuits, etc.

For example, in cases like the shift register shown in FIG. 12, each logic circuit connected in cascade becomes unstable due to the influence of logic switching in the neighboring circuit, thereby causing logic errors. This creates the problem of limitations in circuit design, such as not being able to place adjacent to one another circuits operated by pulse power sources of different phases; i.e., different pulse power sources.

Further, in the MOS logic circuit F0, as shown in FIG. 15, there are parasitic pn diodes shown by reference symbols D1 and D2 between the drain of the NMOS transistor QN1 and p well 5, and between the drain of the PMOS transistor QP1 and n well 6, respectively.

For this reason, when the RESET operation is performed when the output node KO2 is outputting a low level, since in the initial state of the RESET operation the pulse power source φ is high level and the input node KI1 low level, the pn diode D2 between the drain of the PMOS transistor QP1 and the p well 6 is reverse biased, and a charge is stored in the junction capacitance of the pn diode D2. Conversely, since the same potential is applied across the pn diode D1 between the drain of the NMOS transistor QN1 and the n well 5, no charge is stored in the junction capacitance of the pn diode D2.

Accordingly, when the pulse power source φ falls from high level to low level in the RESET operation, the charge stored in the junction capacitance of the pn diode D2 is distributed to the junction capacitance of the pn diode D1, and therefore the potential of the output node KO2 drops to a negative value, which is lower than the ground level which is the output level of the constant-voltage power source. Hence the problem arises that that much additional energy is required in recharging.

Other conventional art intended to solve this kind of problem is the 2N–2N2P circuit proposed in the paper by Kramer, et.al. referred to above. FIG. 16 is an electrical circuit diagram of a MOS logic circuit F10 of the type proposed by this other conventional art. In this MOS logic circuit F10, elements similar to and corresponding with those in the MOS logic circuit F0 shown in FIG. 10 will be given the same reference symbols, and explanation thereof will be omitted.

In this MOS logic circuit F10, NMOS transistors QN3 and QN4 are provided parallel to NMOS transistors QN1 and QN2, respectively. The gate electrode of the NMOS transistor QN3 is connected to the gate electrode of a PMOS transistor QP1, i.e., to an output node KO1, and the gate electrode of the NMOS transistor QN4 is connected to the gate electrode of a PMOS transistor QP2, i.e., to an output node KO2.

Accordingly, during the HOLD operation, when, for example, the output node KO1 is maintained at high level, the NMOS transistor QN3 is turned on, so even if the input IN$^+$ drops to low level, the output node KO2 can be stably maintained at a low level. In this way, the MOS logic circuit F10 is arranged so that even if both the inputs IN$^+$ and IN$^-$ fall to low level, the low-level output remains stable.

Further, when the RESET operation is performed when the output OUT$^-$ from the output node KO2 is at low level, the NMOS transistor QN3 is turned on, or if when the output OUT$^+$ from the output node KO1 is at low level, the NMOS transistor QN4 is turned on, and in either case there will be no storage of a charge as shown in FIG. 15. Thus power consumption can be held to a minimum.

Although there is more freedom of design with the MOS logic circuit F10 because there is no influence from neighboring circuits, it has the problem that two additional NMOS transistors QN3 and QN4 per unit logic circuit are required, and that the size per unit logic circuit is increased by 5/4 times.

SUMMARY OF THE INVENTION

The object of the present invention is to provide a MOS logic circuit capable of stable operations with low power consumption and without causing increase in circuit size.

In order to attain this object, a MOS logic circuit of the present invention is comprised of:
(1) a clamp circuit having a pair of PMOS transistors, the gate electrode of each of which is cross-connected to the drain electrode of the other, and the source electrode of each of which is connected to a pulse power source; and
(2) two functional circuits, each of which has at least one NMOS transistor, the gate electrode of each NMOS transistor serving as an input node, one terminal of each functional circuit being connected to a common constant-voltage power source, and the other terminal thereof being an output node and being connected to the drain electrode of the corresponding PMOS transistor;
the substrate electrode of each of the NMOS transistors making up the functional circuits being cross-connected to the output node of the other functional circuit.

With this arrangement, if each of the functional circuits is made up of one NMOS transistor, the MOS logic circuit will be a basic circuit referred to above as the 2N–2P circuit, which is capable of low-power-consumption operation through adiabatic charging. In this kind of MOS logic circuit, the substrate electrode of each NMOS transistor is cross-connected to the output node of the other functional circuit.

Accordingly, during a HOLD operation in which both the inputs are at low level while the pulse power source remains at high level, high level is applied to the substrate of the NMOS transistor which is to output a low level, and the NMOS transistor is given a forward bias so as to have depletion-mode characteristics, and maintains its on condition. In this way, logic errors due to the influence of neighboring circuits can be prevented without causing increase in the number of NMOS transistors or increased circuit size.

Further, because of the forward bias mentioned above, even if a RESET operation is performed while the output is at low level, the corresponding NMOS transistor will remain on without fail, the capacitive coupling shown in FIG. 15 will not occur, and thus the consumption of additional power during recharging can be avoided.

The other objects, features, and superior points of this invention will be made clear by the description below.

Further, the advantages of this invention will be evident from the following explanation in reference to the Figures.

BRIEF DESCRIPTION OF THE DRAWINGS

FIG. 14 is a diagram showing the operating states of each inverter/buffer, for explaining the shift register shown in FIG. 12.

DESCRIPTION OF THE EMBODIMENTS

The following is an explanation of the first embodiment of the present invention, referring to FIGS. 1 through 4 and FIG. 11.

Figure 1:
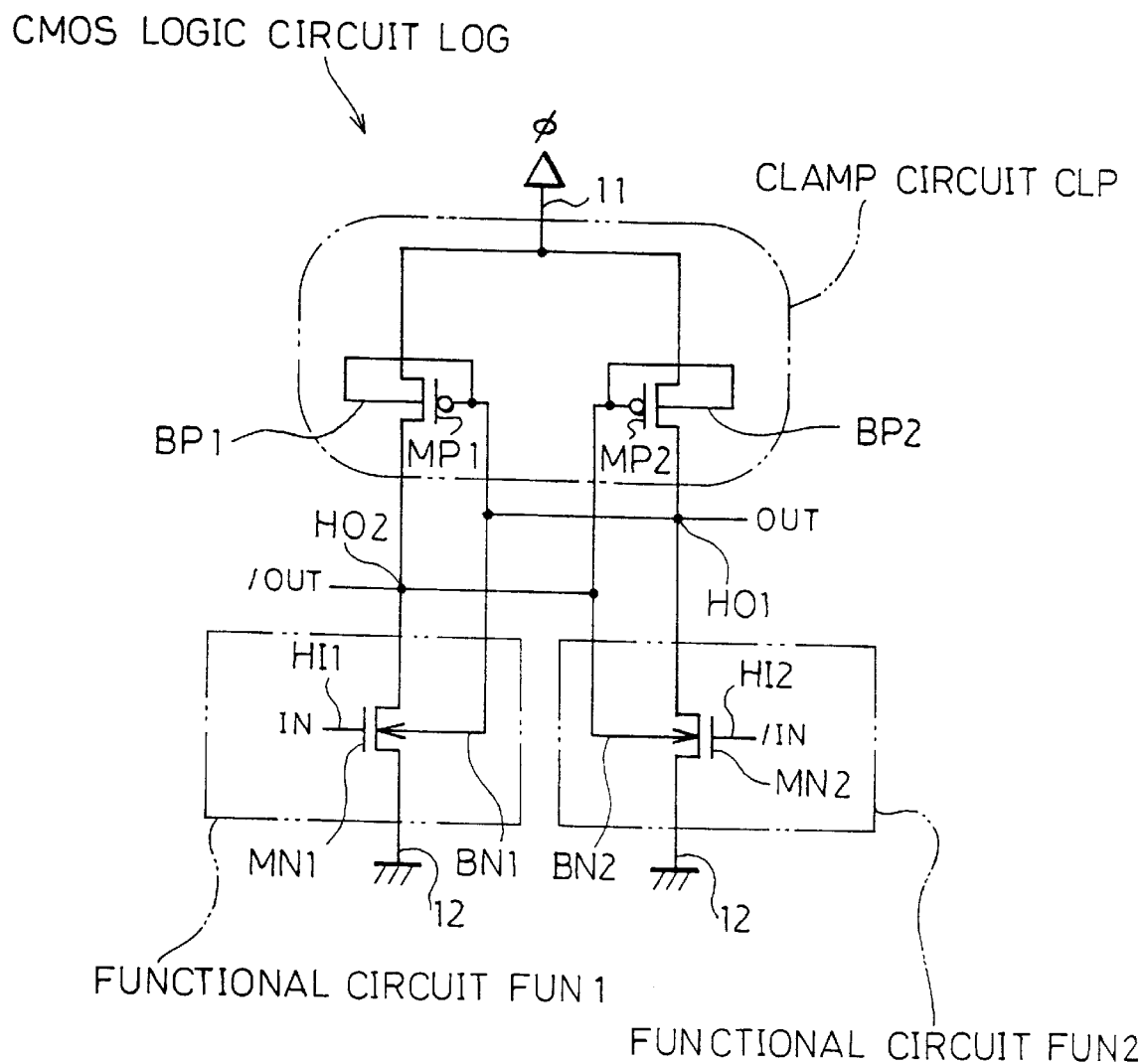
FIG. 1 is an electric circuit diagram of a MOS logic circuit in the first embodiment of the present invention.

FIG. 1 is an electric circuit diagram of MOS logic circuit LOG in accordance with the first embodiment of the present invention. The MOS logic circuit LOG is a unit logic circuit. Numbers of the MOS logic circuits LOG may be combined and assembled together in, for example, cascade connection on an integrated circuit substrate in order to obtain the desired logic between input and output. In brief, the MOS logic circuit LOG is made up of a clamp circuit CLP and two functional circuits FUN1 and FUN2.

The clamp circuit CLP is made up of a pair of PMOS transistors MP1 and MP2. The MOS logic circuit LOG shown in FIG. 1 shows an inverter/buffer as one example of a logic circuit, and thus takes the form of a basic circuit structure in which the respective functional circuits FUN1 and FUN2 have one NMOS transistor, i.e., NMOS transistors MN1 and MN2, respectively.

The source electrode of each of the PMOS transistors MP1 and MP2 is connected to a common power line 11, and the power line 11 is connected to a pulse power source φ for performing adiabatic charging. The gate electrode of each of the NMOS transistors MN1 and MN2, on the other hand, is connected to input nodes HI1 and HI2, respectively, through which inputs IN and $\overline{\text{IN}}$ are applied. Further, the source electrode of each of the NMOS transistors MN1 and MN2 is connected, through a power line 12, to a constant-voltage power source which outputs a ground level.

The drain electrode of the PMOS transistor MP1 and the drain electrode of the NMOS transistor MN1 are connected to each other, providing output node HO2, which outputs the output $\overline{\text{OUT}}$. The output node HO2 is also cross-connected to the gate electrode of the PMOS transistor MP2. In the same way, the drain electrode of the PMOS transistor MP2 and the drain electrode of the NMOS transistor MN2 are connected to each other, providing output node HO1, which outputs the output OUT. The output node HO1 is also cross-connected to the gate electrode of the PMOS transistor MP1. The gate electrode of the PMOS transistor MP1 is connected to the substrate electrode BP1 of the PMOS transistor MP1, and the gate electrode of the PMOS transistor MP2 is connected to the substrate electrode BP2 of the PMOS transistor MP2.

Accordingly, when the pulse power source φ rises to high level while the input IN is at high level, the NMOS transistor MN1 is turned on, and the output $\overline{\text{OUT}}$ falls to low level. As a result, the PMOS transistor MP2 is turned on, and the output OUT rises to high level. Conversely, when the pulse power source φ rises to high level while the input $\overline{\text{IN}}$ is at high level, the NMOS transistor MN2 is turned on, and the output OUT falls to low level. As a result, the PMOS transistor MP1 is turned on, and the output $\overline{\text{OUT}}$ rises to high level.

It should be noted that, in the present invention, the substrate electrode BN1 of the NMOS transistor MN1 is connected to the gate electrode of the PMOS transistor MP1, i.e., to the output node HO1, and that when the output OUT rises to high level, the NMOS transistor MN1 becomes forward biased. In the same way, the substrate electrode BN2 of the NMOS transistor MN2 is connected to the gate electrode of the PMOS transistor MP2, i.e., to the output node HO2, and when the output $\overline{\text{OUT}}$ rises to high level, the NMOS transistor MN2 becomes forward biased.

Figure 2:
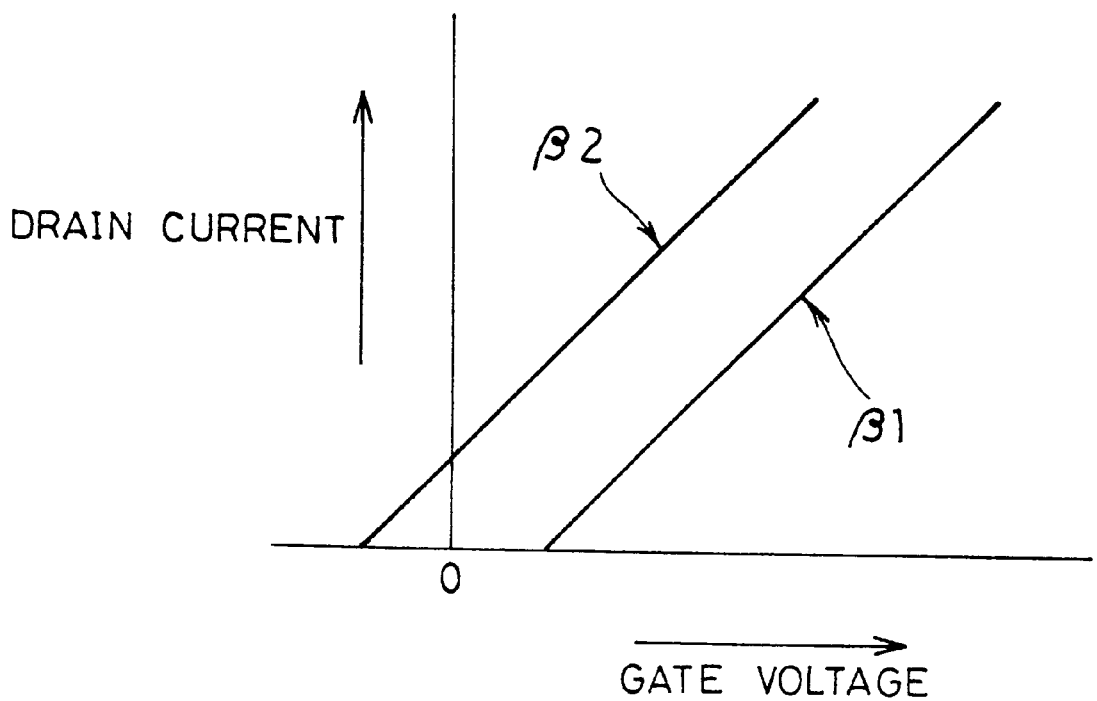
FIG. 2 is a graph explaining operation characteristics of an NMOS transistor.

The threshold voltages of the NMOS transistors MN1 and MN2 are adjusted so that when the substrate electrodes BN1 and BN2 are at low level (ground level), the NMOS transistors MN1 and MN2 show enhancement mode transistor characteristics as shown by reference symbol β1 on FIG. 2, and when the substrate electrodes BN1 and BN2 are at high level (i.e., when the pulse power source φ is at peak voltage Vdd), the NMOS transistors MN1 and MN2 show depletion mode transistor characteristics as shown by reference symbol β2 on FIG. 2.

The operations of the MOS logic circuit LOG structured as described above are as shown in FIG. 11. The wave forms of the input IN, the input $\overline{\text{IN}}$, the pulse power source φ, the output OUT, and the output $\overline{\text{OUT}}$ in FIG. 1 correspond to FIGS. 11(a), (b), (c), (d), and (e), respectively.

Figure 11:
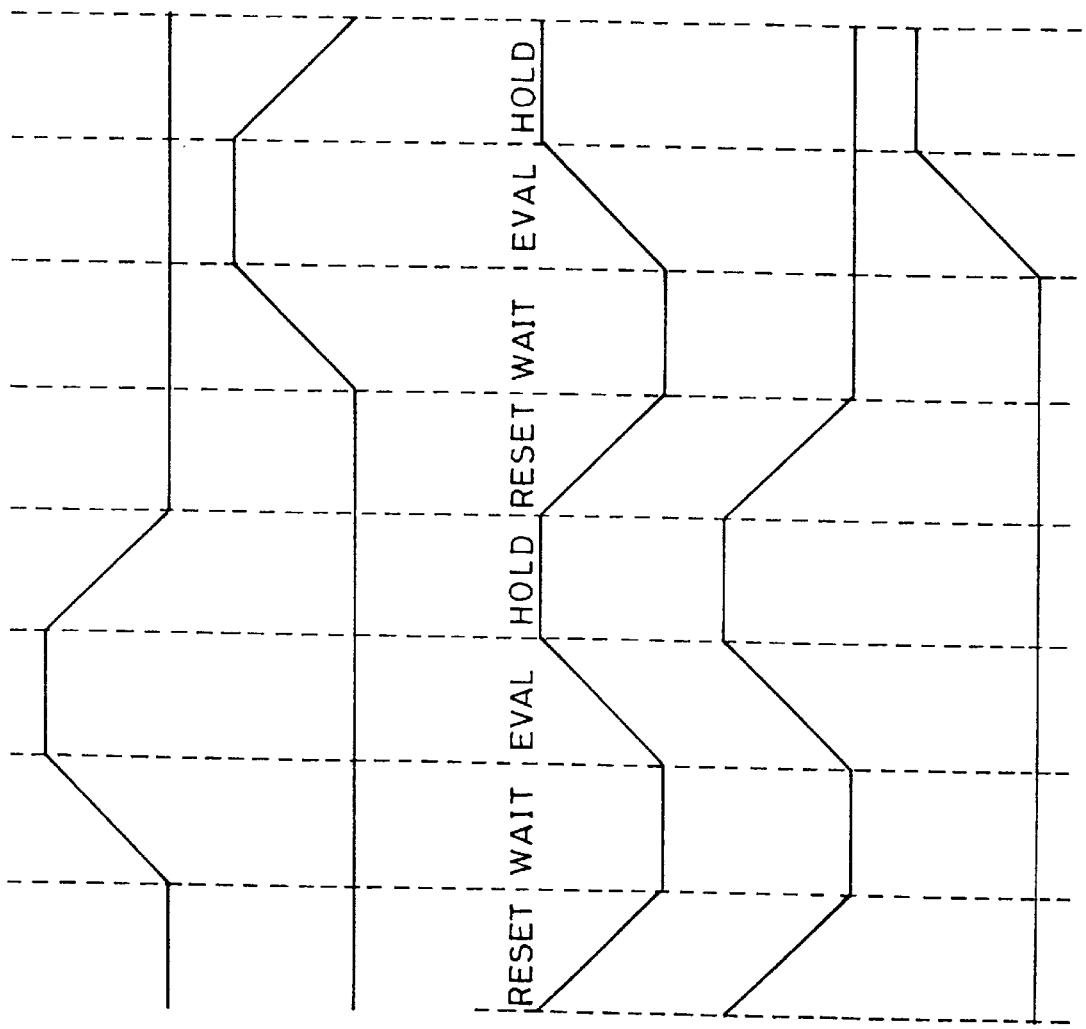
FIGS. 11(a) through (e) explain both the present invention and the conventional art, and are a wave-form diagram explaining the operations of the MOS logic circuits shown in FIGS. 1, 10, and 12.
Figure 12:
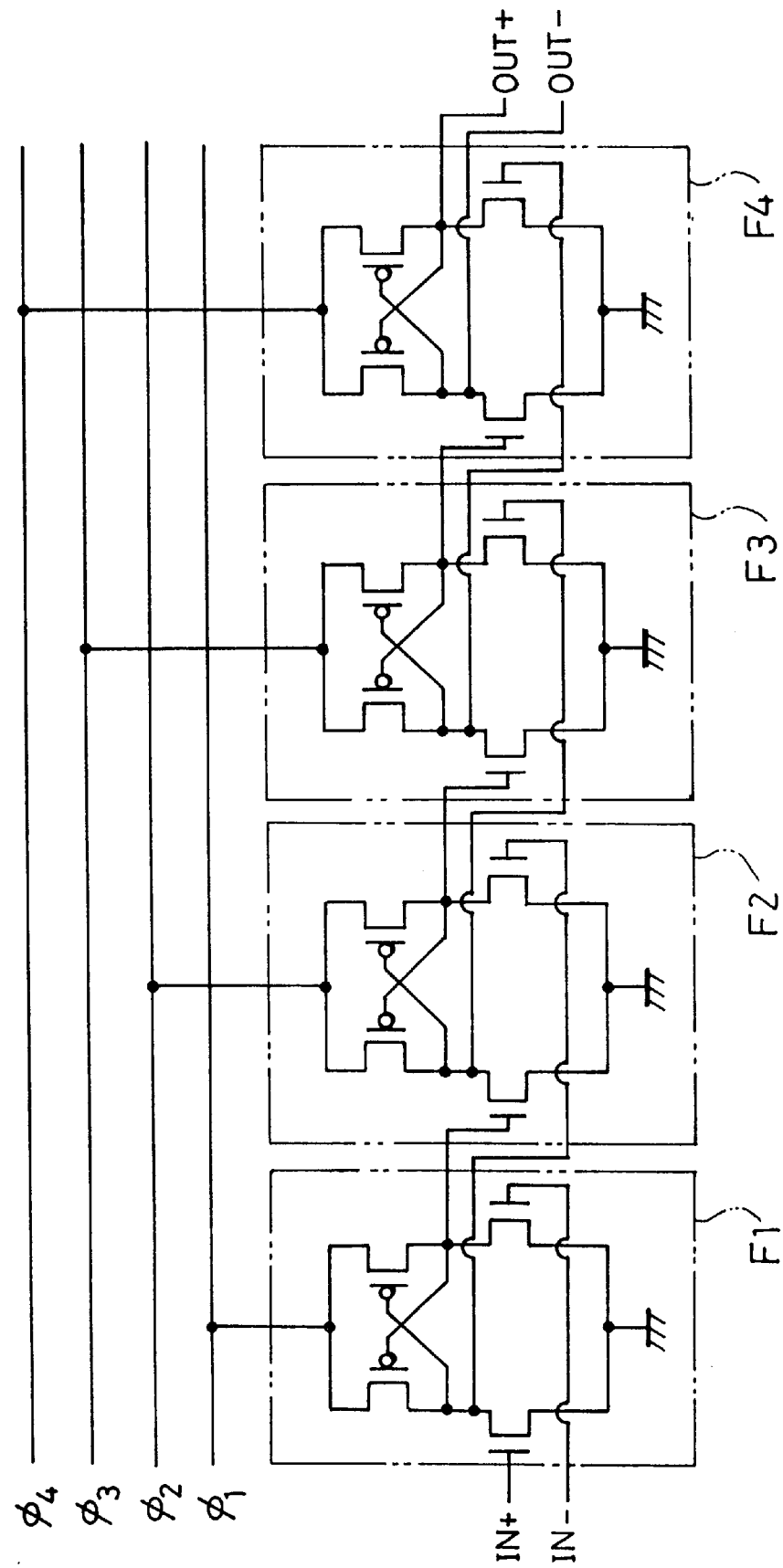
FIG. 12 is an electric circuit diagram of a shift register realized by the MOS logic circuit shown in FIG. 10.
Figure 13:
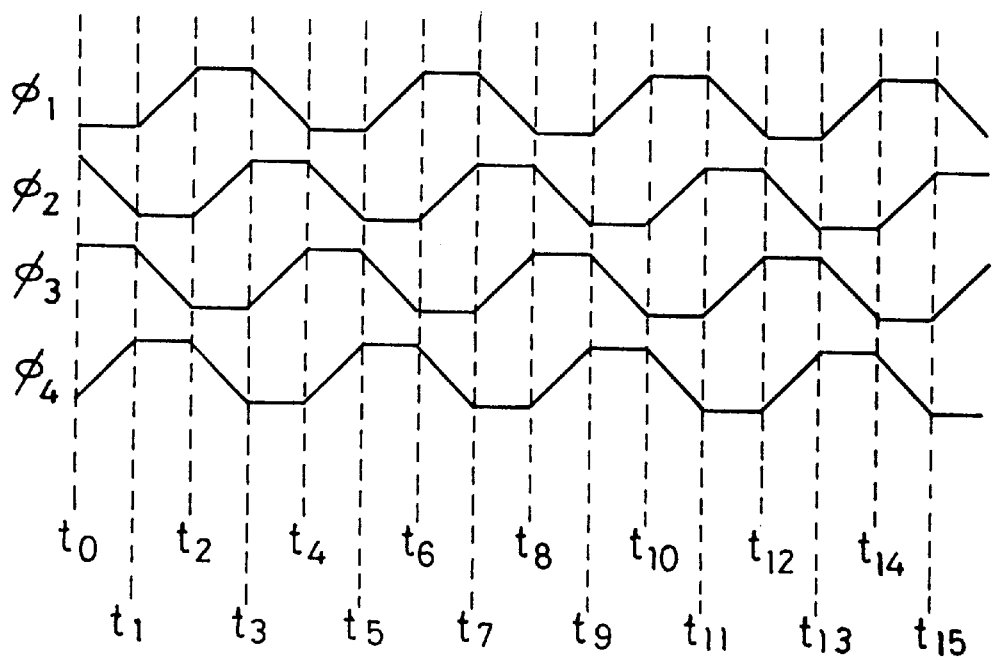
FIG. 13 is a wave-form diagram of a pulse power source, for explaining the operations of the shift register shown in FIG. 12.

First, in the RESET operation, when the pulse power source φ falls from high level to low level, the high-level output (in the example in FIG. 11, (d), which is the output OUT) also falls to low level, and as a result the output data is erased. In the WAIT operation, the pulse power source φ remains at low level, and either the input IN or the input $\overline{\text{IN}}$ (in the example in FIG. 11, (a), which is the input IN) rises from low level to high level. When high-level input has been established in this way, by means of the EVALUATE operation, the input which is high level (FIG. 11(a)) is maintained at high level, and the voltage of the pulse power source φ rises from low level to high level. This is accompanied by a rise from low level to high level in the output which is to be high-level (in the example in FIG. 11, (d), which is the output OUT). When the output has been established in this way, by means of the HOLD operation, even if both of the inputs IN and $\overline{\text{IN}}$ fall to low level and the input is erased, the high-level output is maintained.

In operations such as those described above, in the present invention, during the HOLD operation, the substrate electrode of whichever of the NMOS transistors MN1 and MN2 is to output a low level has a high-level output applied to it, thus stably maintaining the other output at a low level. For example, if the NMOS transistor MN1 is to output a low level, the high-level output OUT is applied to the substrate electrode BN1 of the NMOS transistor MN1, and, as shown in FIG. 2, the characteristics of the NMOS transistor MN1 become depletion mode, and the output $\overline{\text{OUT}}$ is stably fixed at a low level. In this state, even if the RESET operation is performed, the NMOS transistor MN1 will be turned on without fail, the capacitive coupling shown in FIG. 15 will not occur, and thus the consumption of additional power during recharging can be avoided.

Figure 16:
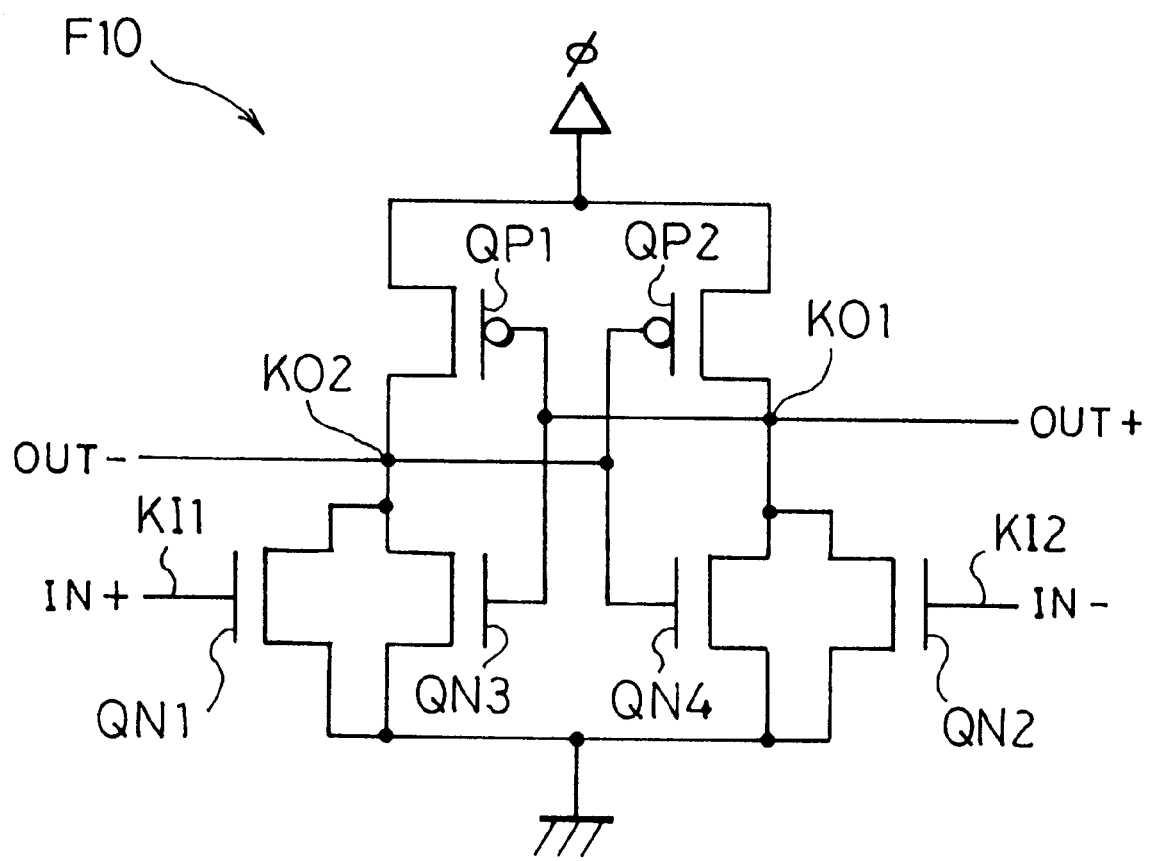
FIG. 16 is an electric circuit diagram of another conventional MOS logic circuit.

Accordingly, even when many MOS logic circuits LOG (which are the unit logic circuits) are combined, stable operations can be performed without influence from neighboring circuits, thus increasing the freedom of circuit design. Furthermore, in fixing the low-level output at the ground level in this way, whereas in the MOS logic circuit F10 shown in FIG. 16, the NMOS transistors QN3 and QN4 were necessary, in the present invention, the circuit remains the 2N–2P circuit structure discussed above, and increase of the number of transistors, and of circuit size, is avoided.

In addition to the foregoing effect, since the substrate electrodes BP1 and BP2 of the PMOS transistors MP1 and MP2 are connected to the respective gate electrodes of the PMOS transistors, their threshold voltages can be reduced, and a low operating voltage can be used. In this way, further reduction in power consumption can be realized.

Figure 3:
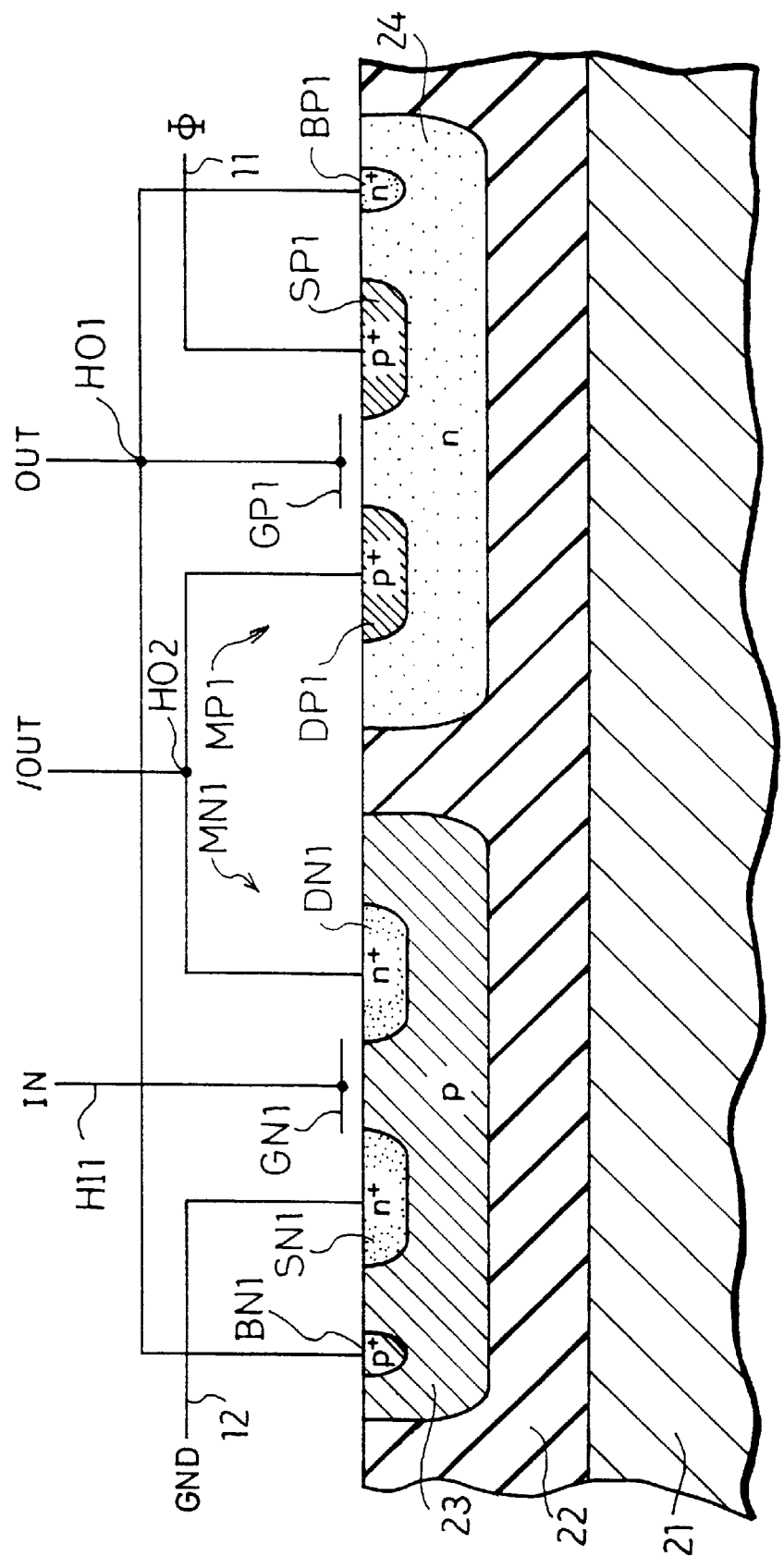
FIG. 3 is a fragmentary cross-sectional diagram of a MOS logic circuit, explaining one concrete example of a structure for the MOS logic circuit shown in FIG. 1.
Figure 4:
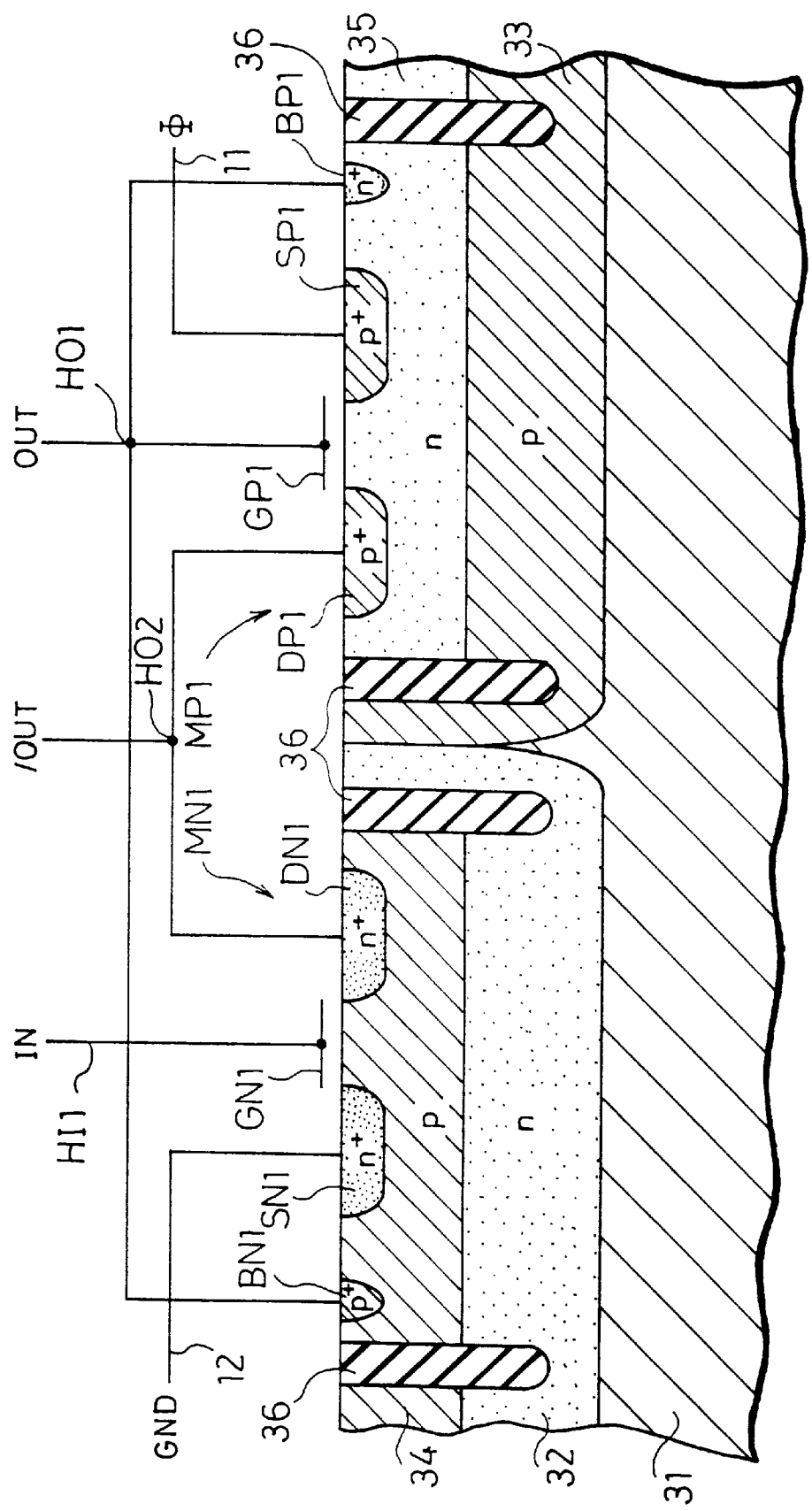
FIG. 4 is a fragmentary cross-sectional diagram of a MOS logic circuit, explaining another concrete example of a structure for the MOS logic circuit shown in FIG. 1.

In the present invention, the substrate potential of each of the MOS transistors MP1, MP2, MN1, and MN2 must be controlled separately, but this may be realized by means of a structure such as those shown in FIGS. 3 and 4.

FIG. 3 is a cross-sectional diagram explaining one concrete example of a structure for realizing the MOS logic circuit LOG in the present invention. This structure is a so-called an SOI (Silicon On Insulator) structure, and FIG. 3 shows the vicinity of MOS transistors MN1 and MP1. In a SIMOX substrate, which is a representative SOI structure substrate, the surface of silicon substrate 21 is impregnated with oxygen, and then heat-treated to provide insulating layer 22, thus insulating and separating the silicon substrate 21 from the other elements provided above it.

When the regular MOS transistor manufacturing process is carried out on a substrate of this type, each transistor will be separated from the other by insulator.

Alternatively, instead of the structure shown in FIG. 3, the structure shown in FIG. 4 is also possible. In this case, on the surface of silicon substrate 31 in the NMOS transistor MN1 area, deep n well 32 is first provided, and in the PMOS transistor MP1 area, deep p well 33 is provided. On top of these wells 32 and 33 are then provided shallow p well 34 and shallow n well 35, respectively, and the shallow p well 34 and the shallow n well 35 become the substrates for the NMOS transistor MN1 and the PMOS transistor MP1, respectively.

On the shallow p well 34 are provided a source area SN1, a drain area DN1, and a substrate electrode BN1, as well as a gate electrode GN1, etc., and on the shallow n well 35 are formed a source area SP1, a drain area DP1, and a substrate electrode BP1, as well as a gate electrode GP1, etc. Each of the MOS transistors MN1 and MP1 maintains good insulation from the other by means of so-called trench separation, in which the insulator separation is realized by trenches 36 provided around the perimeter of each transistor. Through electrodes (not shown) are applied potentials corresponding to low level and high level to the deep n well 32 and the deep p well 33, respectively, so that, even if the potentials of the shallow p well 34 and the shallow n well 35, respectively, change, respective reverse bias states will always be maintained.

In the present invention, since the respective forward biases are applied to the substrate electrodes BN1 and BN2 of the NMOS transistors MN1 and MN2, the potential difference between high level and low level, i.e., Vdd referred to above, must be 0.6V or less.

Figure 5:
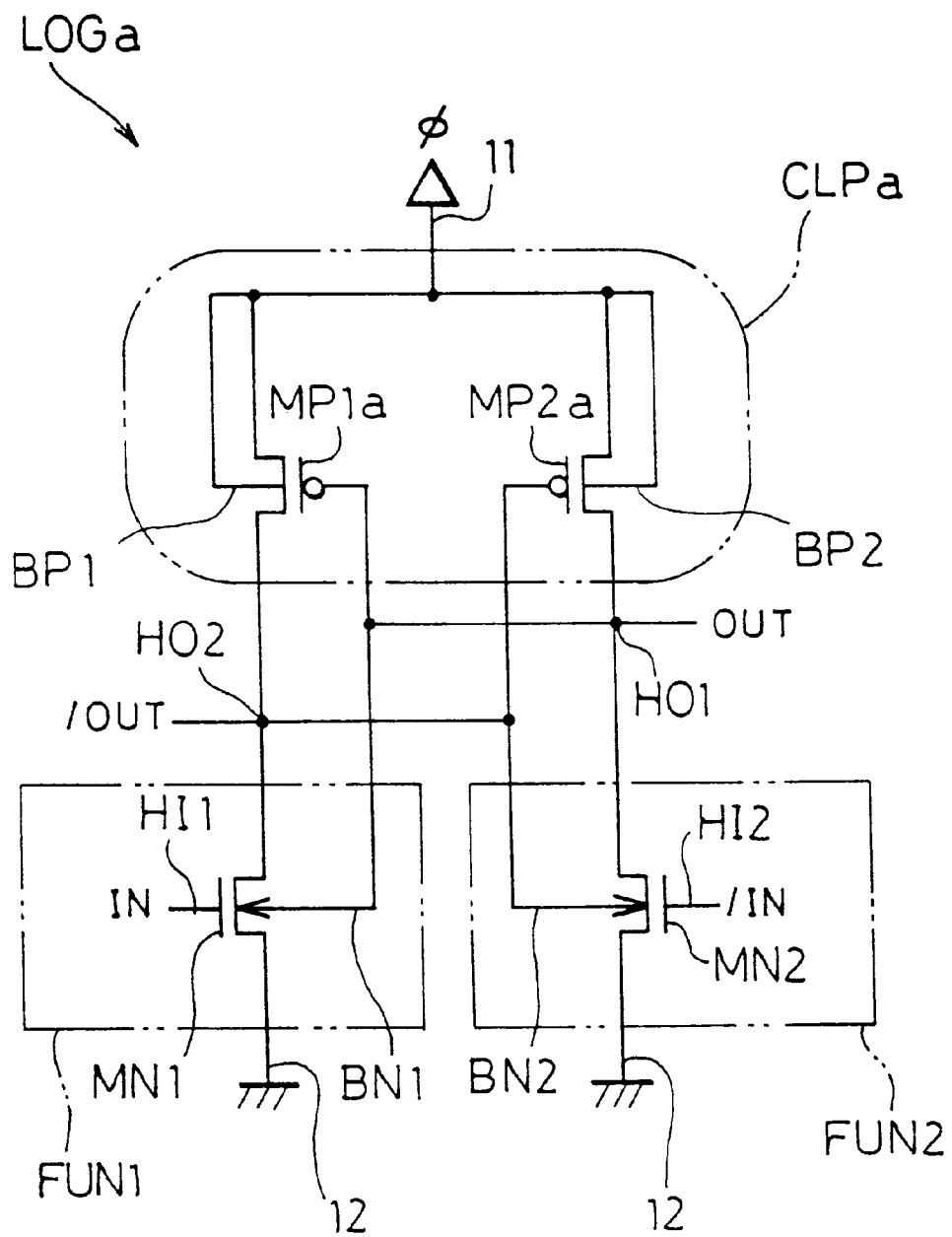
FIG. 5 is an electric circuit diagram of a MOS logic circuit in the second embodiment of the present invention.

The following is an explanation of the second embodiment of the present invention, referring to FIG. 5.

FIG. 5 is an electric circuit diagram of MOS logic circuit LOGa in accordance with the second embodiment of the present invention. In this MOS logic circuit LOGa, members similar to and corresponding with those of the MOS logic circuit LOG will be given the same reference symbols, and explanation thereof will be omitted. In the MOS logic circuit LOGa, substrate electrodes BP1 and BP2 of PMOS transistors MP1a and MP2a, which make up a clamp circuit CLPa, are connected to the respective source electrodes of the PMOS transistors.

Accordingly, the PMOS transistors MP1a and MP2a must be given high threshold voltages, but since there is no connection between the gate and the substrate, so that direct current will no longer flow from the source electrode through the pn junction, it can be made more difficult for the direct current to flow from the pulse power source φ to the ground level, and thus power consumption can be reduced.

Figure 6:
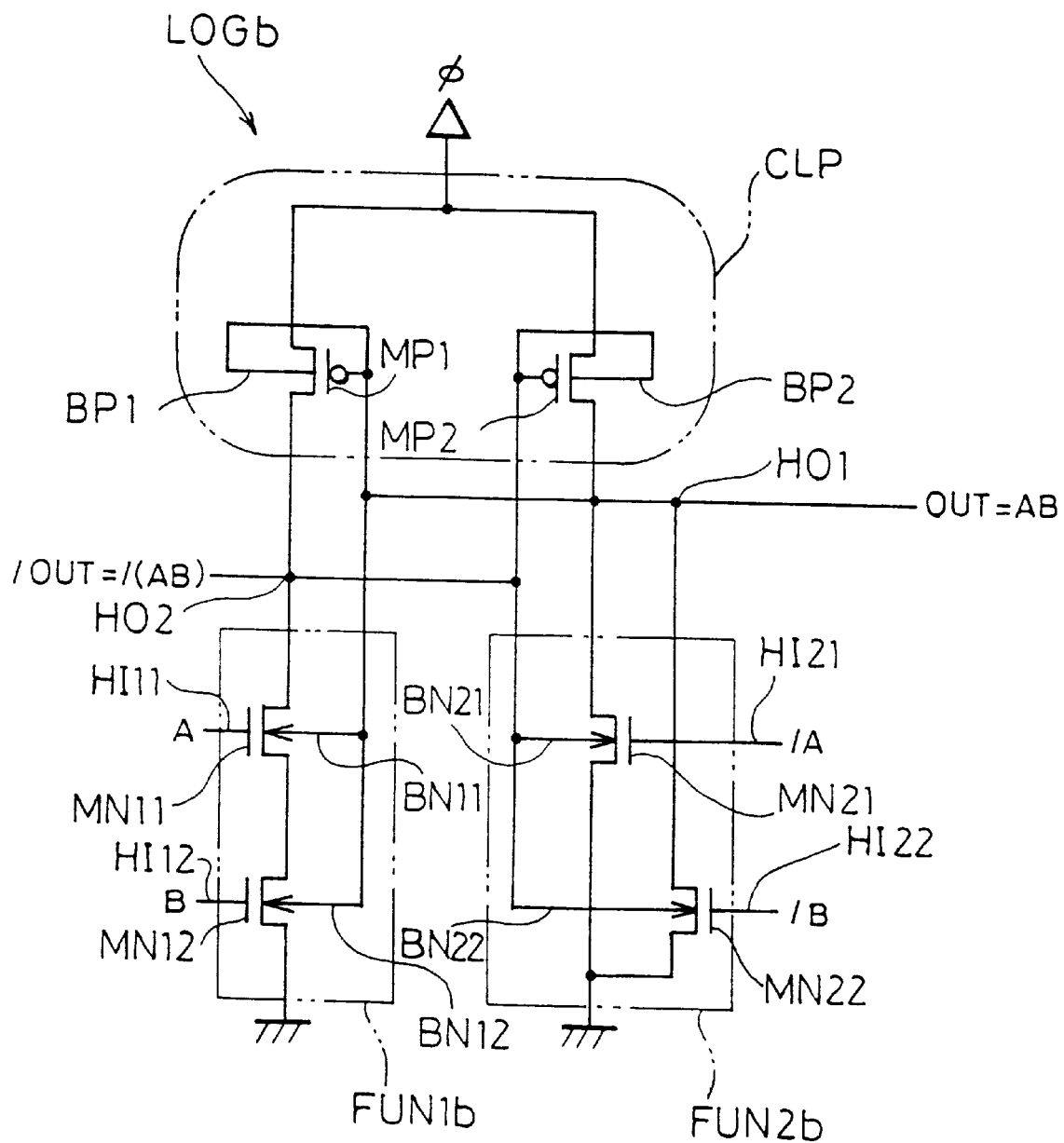
FIG. 6 is an electric circuit diagram of a MOS logic circuit in the third embodiment of the present invention.
Figure 7:
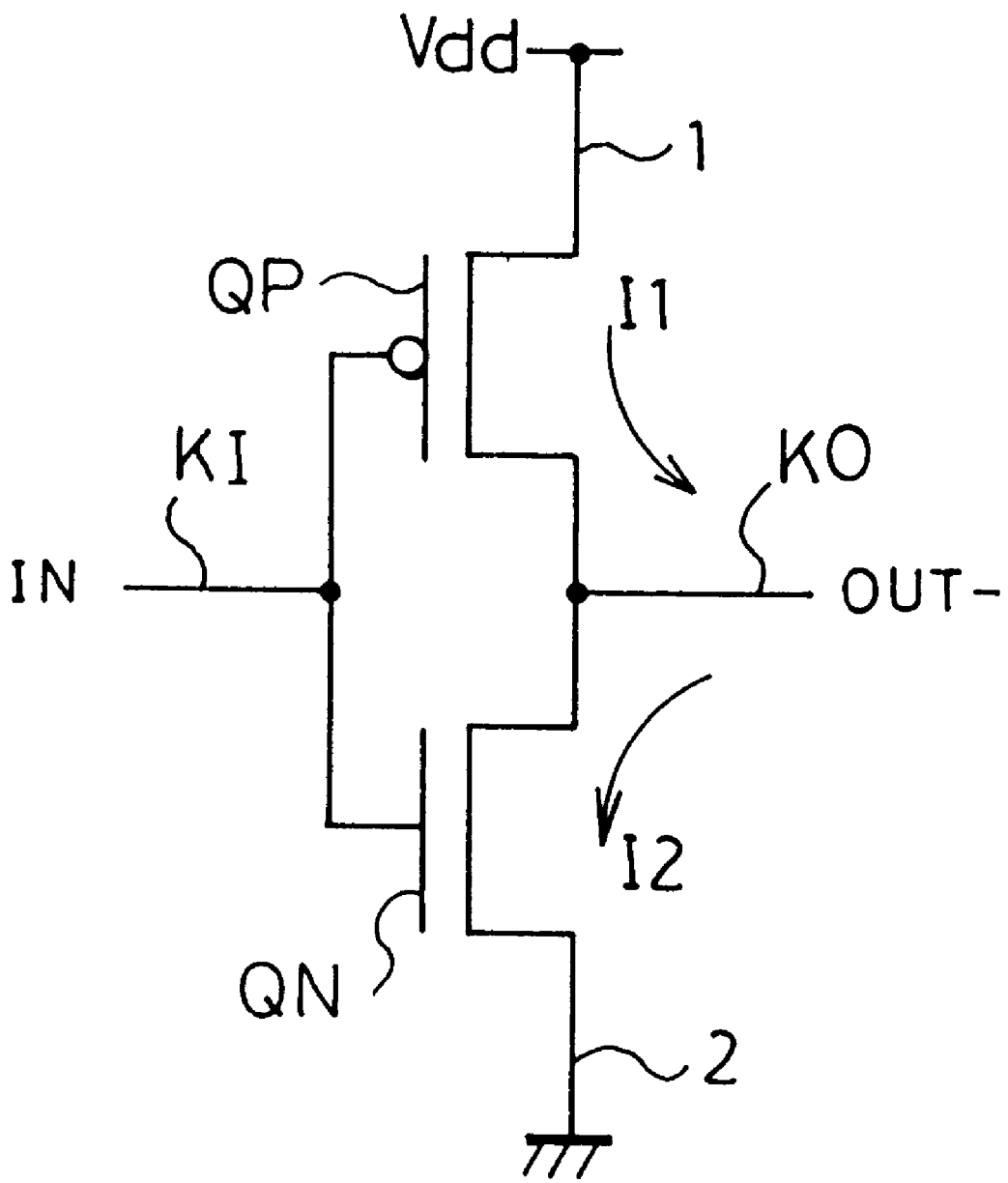
FIG. 7 is a circuit diagram explaining the charging and discharging operations of a CMOS inverter.
Figure 8:
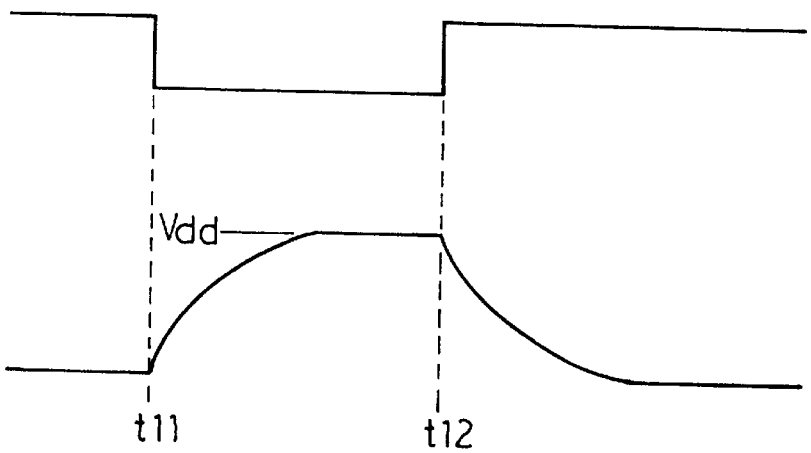
FIGS. 8(a) and (b) are wave-form diagrams explaining the operations of the CMOS inverter shown in FIG. 7.
Figure 9:
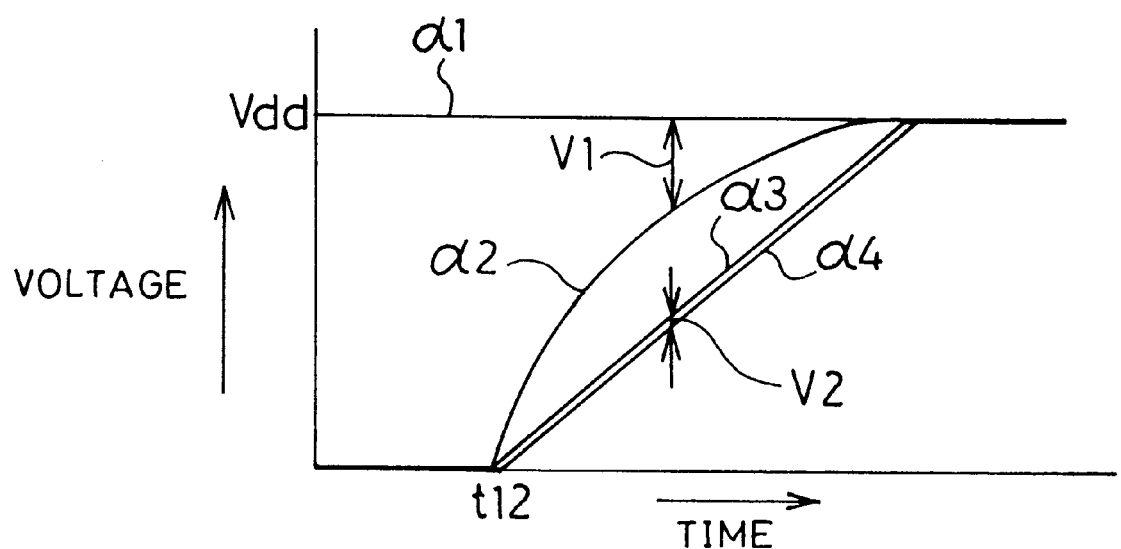
FIG. 9 is a graph explaining the difference between regular charging and adiabatic charging.
Figure 10:
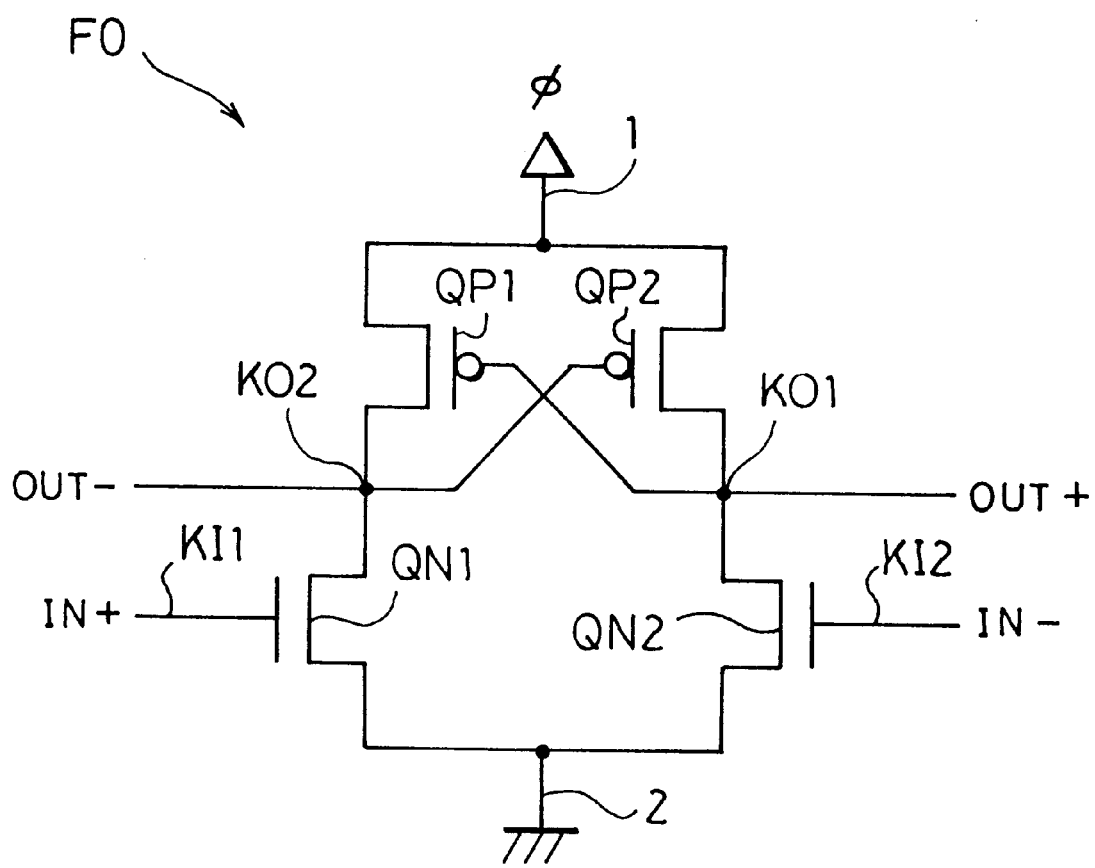
FIG. 10 is an electric circuit diagram of a typical conventional MOS logic circuit using this adiabatic charging.

The following is an explanation of the third embodiment of the present invention, referring to FIG. 6.

FIG. 6 is an electric circuit diagram of MOS logic circuit LOGb according to the third embodiment of the present invention. In the MOS logic circuit LOGb, members similar to and corresponding with those of MOS logic circuit LOG will be given the same reference symbols, and explanation thereof will be omitted.

In the MOS logic circuit LOGb, functional circuits FUN1b and FUN2b are provided with two NMOS transistors each, MN11 and MN12, and MN21 and MN22, respectively. In concrete terms, in the functional circuit FUN1b, the NMOS transistors MN11 and MN12 are connected in series with each other, but in the functional circuit FUN2b, the NMOS transistors MN21 and MN22 are connected in parallel with each other.

The gate electrodes of the NMOS transistors MN11 and MN12 serve as input nodes HI11 and HI12, respectively, to which are applied inputs A and B, respectively. Through the output node HO1, an output value OUT is applied to the substrate electrodes BN11 and BN12 of the NMOS transistors MN11 and MN12 respectively. The gate electrodes of the NMOS transistors MN21 and MN22, on the other hand, serve as input nodes HI21 and HI22, respectively, to which are applied inputs $\overline{A}$ and $\overline{B}$, respectively. Through the output node HO2, an output value $\overline{OUT}$ is applied to the substrate electrodes BN21 and BN22 of the NMOS transistors MN21 and MN22 respectively.

In the above structure, when at least one of the inputs A and B is at low level (and, accordingly, at least one of the inputs $\overline{A}$ and $\overline{B}$ is at high level), the NMOS transistor MN21 or MN22 is turned on, and therefore the output OUT (the output node HO1) falls to low level. The low level of the output OUT is sent to the gate electrode of the PMOS transistor MP1, thus turning on the PMOS transistor MP1. As a result, the output $\overline{OUT}$ (the output node HO2) rises to high level.

On the other hand, when both the input A and the input B are high level, both of the NMOS transistors MN11 and MN12 are turned on, and therefore the output $\overline{OUT}$ (the output node HO2) falls to low level. The low level of the output $\overline{OUT}$ is sent to the gate electrode of the PMOS transistor MP2, thus turning on the PMOS transistor MP2. As a result, the output OUT (the output node HO1) rises to high level. In this way, in the MOS logic circuit LOGb, AND logic A·B is furnished by the output OUT, and NAND logic $\overline{(A \cdot B)}$ by the output $\overline{OUT}$.

If the output $\overline{OUT}$ is outputted by the output node HO1 and the output OUT by the output node HO2, the output OUT furnishes NAND logic. Further, if the input logic values are changed, inputting the input A to the input node HI21, the input B to the input node HI22, the input $\overline{A}$ to the input node HI11, and the input $\overline{B}$ to the input node HI12, the output OUT furnishes NOR logic, and the output $\overline{OUT}$ furnishes OR logic.

As described above, the MOS logic circuit LOGb operates as an AND/NAND circuit. In the same way, depending on the structure of the functional circuits FUN1b and FUN2b, the desired logic can be realized.

The MOS logic circuit in the present invention, made up, as explained above, of a clamp circuit and two functional circuits, each functional circuit having at least one NMOS transistor, is a MOS logic circuit called an ECRL circuit or a 2N–2P circuit, capable of low-power-consumption operation through adiabatic charging by use of a pulse power source, and is arranged so that the substrate electrode of each NMOS transistor is cross-connected to the output node of the other functional circuit.

Therefore, during the HOLD operation, in which the pulse power source remains at high level while both inputs are at low level, the substrate of the NMOS transistor which is to output low level (which is to be turned on) is forward biased and becomes depletion mode, and maintains its on state. By this means, logic errors due to the influence of neighboring circuits can be prevented without increasing the number of NMOS transistors, i.e., without increasing circuit size.

Figure 15:
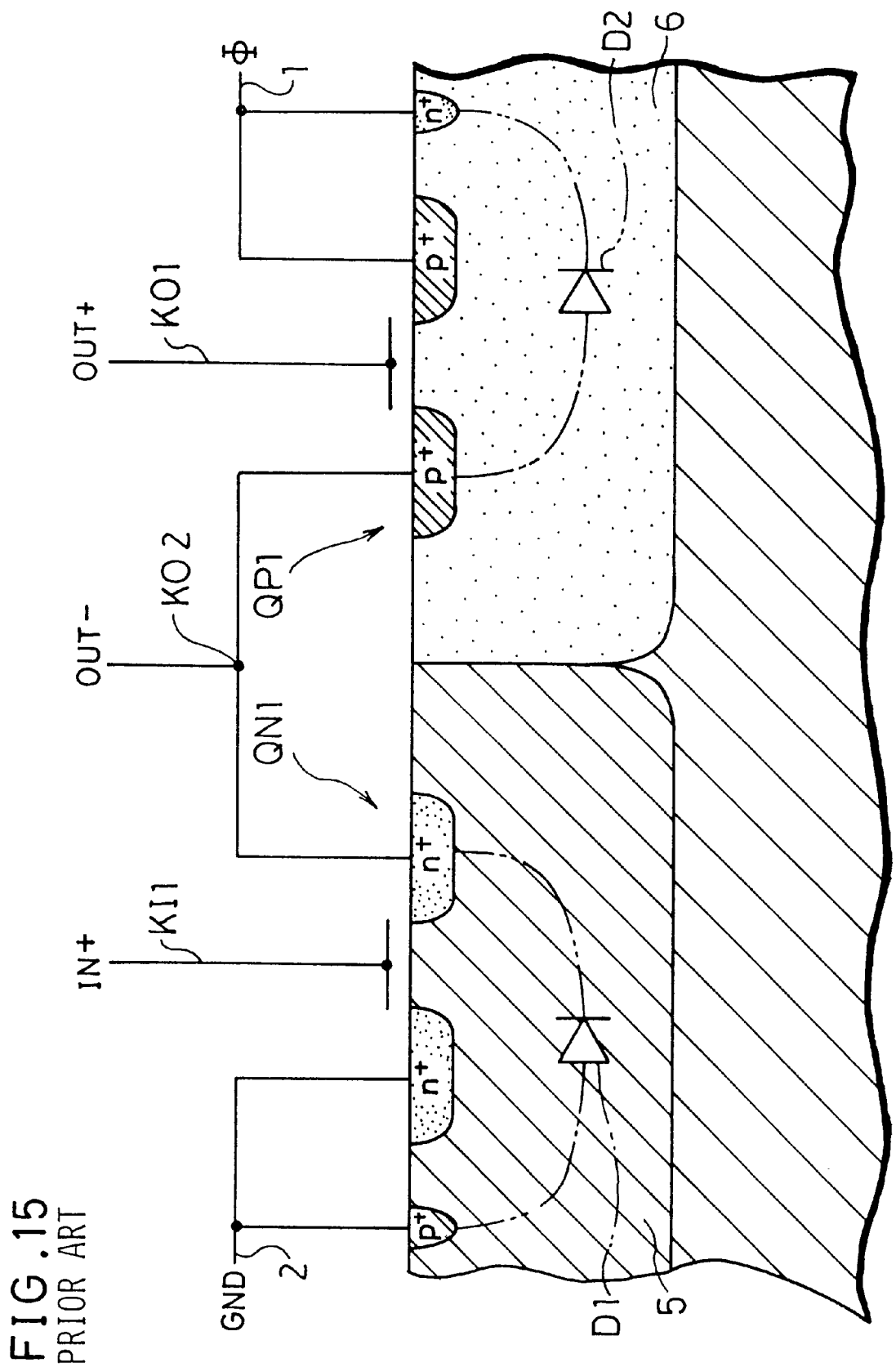
FIG. 15 is an explanatory diagram showing a fragmentary cross-section of the MOS logic circuit shown in FIG. 10, for explaining problems with the MOS logic circuit shown therein.

Further, because of the forward bias mentioned above, even if the RESET operation is performed while the output is at low level, the NMOS transistor in the corresponding functional circuit will be turned on without fail, the capacitive coupling shown in FIG. 15 will not occur, and thus the consumption of extra power during recharging can be avoided.

It is advantageous to connect the substrate electrode of each PMOS transistor in the clamp circuit to the gate electrode of the same PMOS transistor. In this case, the PMOS transistors may be given a low threshold voltage, thus making low voltage operation possible.

It is also advantageous to connect the substrate electrode of each PMOS transistor in the clamp circuit to the pulse power source. In this case, the threshold voltage of the PMOS transistors is raised, but it becomes difficult for the direct current to flow from the pulse power source to the constant-voltage power source, thus making possible a further decrease in power consumption.

It is advantageous for the substrate to be of the SOI structure. In this case, each MOS transistor may be insulated and separated from the others, and it becomes possible to apply a forward bias to the substrate electrodes of the NMOS transistors, as discussed above.

It is also advantageous for each MOS transistor to be electrically separated from the others by a double dispersion area and by insulator. In this case, each MOS transistor may be insulated and separated from the others, and it becomes possible to apply a forward bias to the substrate electrodes of the NMOS transistors, as discussed above.

The concrete embodiments and examples of implementation discussed in the foregoing detailed explanations of the present invention serve solely to illustrate the technical details of the present invention, which should not be narrowly interpreted within the limits of such concrete examples, but rather may be applied in many variations without departing from the spirit of the present invention and the scope of the patent claims set forth below.

What is claimed is:

1. A MOS logic circuit comprising:
   a clamp circuit having a pair of PMOS transistors, each having a gate electrode, a drain electrode, and a source electrode, the gate electrode of each of the PMOS transistors being cross-connected to the drain electrode of the PMOS transistor which is the other member of the pair, and the source electrode of each of the PMOS transistors being connected to a common pulse power source; and
   two functional circuits, each having at least one NMOS transistor, a gate electrode of each of the NMOS transistors serving as an input node, one terminal of each said NMOS transistor being connected to a common constant-voltage power source, and the other terminal of each said NMOS transistor being connected to the drain electrode of its corresponding PMOS transistor and serving as an output node;
   each substrate electrode of the NMOS transistors which constitute the respective functional circuits being cross-connected to the output node of the other functional circuit.

2. The MOS logic circuit according to claim 1, wherein a substrate electrode of each of the PMOS transistors in the clamp circuit is connected to the gate electrode of the corresponding PMOS transistor.

3. The MOS logic circuit according to claim 2, wherein each of the functional circuits is made up of a single NMOS transistor.

4. The MOS logic circuit according to claim 3, wherein the constant-voltage power source outputs ground level.

5. The MOS logic circuit according to claim 2, wherein, in one of the functional circuits, two NMOS transistors are connected in series, and in the other functional circuit, two NMOS transistors are connected in parallel.

6. The MOS logic circuit according to claim 2, wherein a threshold voltage of each of the NMOS transistors is adjusted so that the NMOS transistors show enhanced-mode transistor characteristics when low level is applied to the substrate electrode, and show depletion-mode transistor characteristics when high level is applied to the substrate electrode.

7. The MOS logic circuit according to claim 1, wherein a substrate electrode of each of the PMOS transistors is connected to the pulse power source.

8. The MOS logic circuit according to claim 7, wherein each of the functional circuits is made up of a single NMOS transistor.

9. The MOS logic circuit according to claim 1, wherein the substrate has an SOI structure capable of insulating and separating each of the MOS transistors from each other.

10. The MOS logic circuit according to claim 1, wherein, on the substrate, each of the MOS transistors is electrically isolated from each other by a double dispersion area and by insulator.

11. A MOS logic circuit of adiabatic charging type, comprising a clamp circuit and two functional circuits, each of the functional circuits including at least one NMOS transistor, wherein:
   the functional circuits are arranged so that during a HOLD operation the NMOS transistor which is to be turned on is given a forward bias.

12. The MOS logic circuit according to claim 11, wherein the clamp circuit includes a pair of PMOS transistors, a substrate electrode of each of the PMOS transistors being connected to a gate electrode of the corresponding PMOS transistor.

13. The MOS logic circuit according to claim 11, wherein a substrate electrode of each of the PMOS transistors is connected to a source electrode of the corresponding PMOS transistor.

14. The MOS logic circuit according to claim 12, wherein the substrate has an SOI structure capable of insulating and separating each of the MOS transistors from each other.

15. The MOS logic circuit according to claim 12, wherein, on the substrate, each of the MOS transistors is electrically isolated from each other by a double dispersion area and by insulator.

16. The MOS logic circuit according to claim 11, wherein each of the functional circuits is made up of a single NMOS transistor.

17. The MOS logic circuit according to claim 11, wherein, in one of the functional circuits, two NMOS transistors are connected in series, and in the other functional circuit, two NMOS transistors are connected in parallel.

18. The MOS logic circuit according to claim 11, wherein the threshold voltage of each of the NMOS transistors is adjusted so that the NMOS transistors show enhanced-mode transistor characteristics when low level is applied to a substrate electrode, and show depletion-mode transistor characteristics when high level is applied to the substrate electrode.

* * * * *